United States Patent [19]

Sune

[11] Patent Number: 5,668,036
[45] Date of Patent: Sep. 16, 1997

[54] FABRICATION METHOD OF THE POST STRUCTURE OF THE CELL FOR HIGH DENSITY DRAM

[75] Inventor: Ching-Tzong Sune, Hsinchu, Taiwan

[73] Assignee: Vanguard International Semiconductor Corporation, Hsin-Chu, Taiwan

[21] Appl. No.: 667,695

[22] Filed: Jun. 21, 1996

[51] Int. Cl.$^6$ ............................................. H01L 21/70
[52] U.S. Cl. ............................................. 438/253; 438/254
[58] Field of Search ................................. 437/48, 47, 50, 437/52, 60, 195, 919

[56] References Cited

U.S. PATENT DOCUMENTS

| | | | |
|---|---|---|---|
| 4,582,563 | 4/1986 | Hazuki et al. | 156/643 |
| 4,592,802 | 6/1986 | Deleonibus et al. | 156/644 |
| 5,094,972 | 3/1992 | Pierce et al. | 437/67 |
| 5,312,512 | 5/1994 | Allman et al. | 156/636 |
| 5,595,928 | 1/1997 | Lu et al. | 437/52 |
| 5,595,929 | 1/1997 | Tseng | 437/52 |

OTHER PUBLICATIONS

S. Wolf, "Silicon Processing for the VLSI Era-vol. 2" Lattice Press, Sunset Beach CA, 1990, pp. 598, 609.
"Chemical-Mechanical Polishing: A New Focus on Consumables" by P. Singer, Pubin Semiconductor-Internatioanl, Feb., 1994 pp. 48-52.

Primary Examiner—Jey Tsai
Assistant Examiner—Joni Y. Chang
Attorney, Agent, or Firm—George O. Saile

[57] ABSTRACT

A method is disclosed to form memory cell structures for DRAMs in which the capacitor nodes are formed in the shape of posts that fit in an area no larger than that which is over the active regions of the semiconductor substrate. Hence, the posts are suitable to accommodate the area that is appropriate for any one of the very high density DRAMs up to and including 1 G-bit. Furthermore, one less mask is used to form the node electrode in comparison with prior art. The interior of said post structure constitutes one electrode and the exterior wall the other, while a thin dielectric separates the two polysilicon plates of the capacitor. It is shown that said post structures perform the multi-function of providing a good support during the planarization process. Optional pillars may be formed at judiciously chosen locations in the cell to provide additional storage nodes and/or more uniform support structures to more readily facilitate chemical-mechanical polishing (CMP) of the substrate surface. In an alternate approach for increasing the storage capacity of capacitors in DRAMs, a branched-post structure is used. It is predicted that cells with four branches can allow the manufacture of 1 G-bit DRAMs.

43 Claims, 4 Drawing Sheets

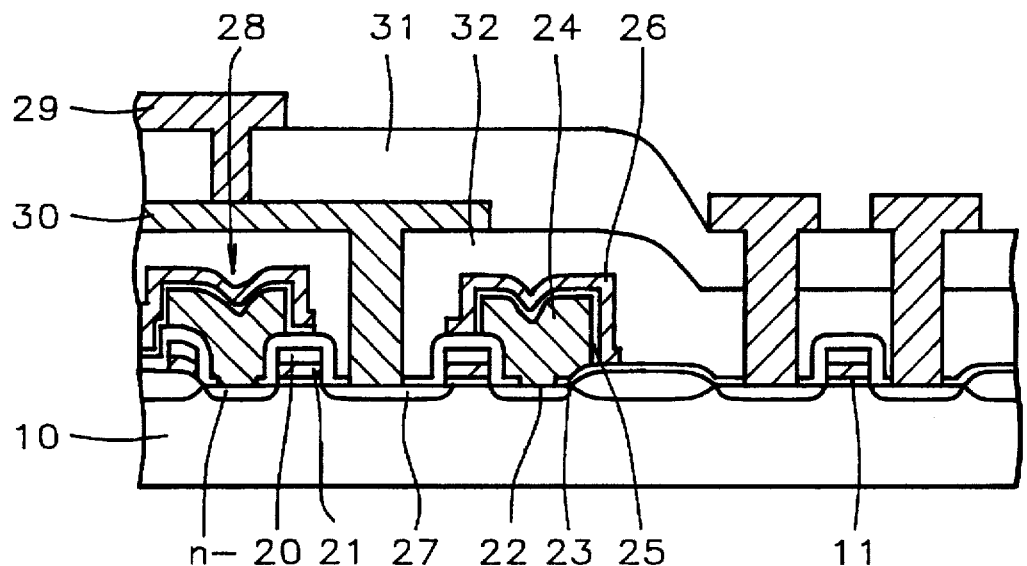
*FIG. 1 - Prior Art*
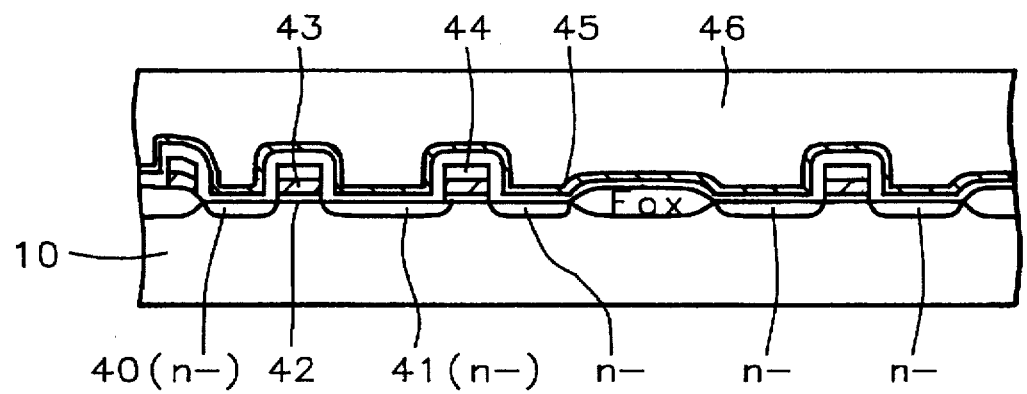
*FIG. 2a*
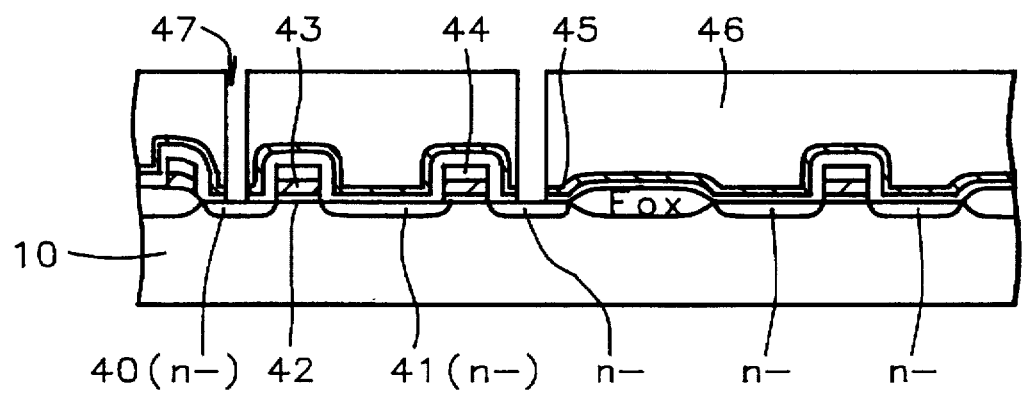
*FIG. 2b*

FABRICATION METHOD OF THE POST STRUCTURE OF THE CELL FOR HIGH DENSITY DRAM

BACKGROUND OF THE INVENTION

1. Field of the Invention

The invention relates generally to semiconductor memories and more particularly to a method of forming memory post structures for high density dynamic random access memories (DRAMs).

2. Description of the Related Art

Over the years, as the dynamic random access memory devices have been scaled down in size, the minimum amount of stored charge needed to maintain reliable memory operation has remained the same. This constant charge-storage value has to be maintained for future DRAM generations as well even as the cell sizes shrink even further.

As is well known in the art, the storage capacity of capacitors in memory cells can be increased by making the capacitor dielectric thinner, by using an insulator with a larger dielectric constant, or by increasing the area of the capacitor. The first two options are not currently viable, since capacitor dielectrics thinner than those now being used in DRAM cells (10 nanometers) will suffer leakage due to Fowler-Nordheim tunneling, and dielectrics with significantly larger dielectric constant than of $SiO_2$ have not yet been accepted for DRAM-cell application. (S. Wolf, "Silicon Processing for the VLSI Era," vol. 2, p.598, Lattice Press, Sunset Beach, Calif., 1990). The third option of increasing the capacitor area can be effective and has been exploited in certain different ways. One way is to form three-dimensional structures in place of planar capacitors. In this approach, the storage capacitor is formed in a trench etched in a semiconductor substrate. The silicon-area reduction of a trench capacitor compared to a planar capacitor can be a factor of eighteen or more, for example. In another approach, the storage capacitor of a cell can be formed, or stacked, on top of its access transistor, thereby shrinking the cell size without a loss of its storage capacity. In still another approach, a three-dimensional effect can be realized by forming a finned structure with leaves extending from the same capacitor trunk. Many variations of such three-dimensional capacitors are reported in prior art.

General usage of trench structures are well known in isolation technology where they are used to isolate devices in integrated circuits. There are differences in these structures, however, when they are used for DRAM capacitors, in particular. As stated earlier, storage capacity is inversely proportional to the dielectric thickness, and therefore, in the case of a trench capacitor, the dielectric film on the walls of the trench must be much thinner than on the walls of an isolation trench. Also, since polysilicon is usually used as the filler material in the trench, and since in the case of a trench capacitor this material also serves as one plate of the capacitor, it must consist of highly doped polysilicon. Usually the semiconductor on the other side of the thin dielectric serves as the other capacitor plate. The role of the polysilicon inside the trench as the storage electrode or plate electrode will vary depending upon the particular design used.

Similar considerations as in trench-capacitors apply when three-dimensional capacitors such as pillars or posts are formed above the access transistors on a semiconductor substrate. In prior art, some of these structures are referred to as stacked capacitors (STCs). (See Wolf cited above, p. 609). As usual, the properties of the dielectric, and the area of the capacitor play a significant role in determining the storage capacity. Thus, for STC cells to be made feasible for high-density DRAMs of 1 Mega-bit and made feasible for high-density DRAMs of 1 Mega-bit and beyond, an insulator with a larger dielectric constant than that of $SiO_2$ must be made available, or novel structures must be developed. In the absence of the former presently, several novel STC cells have been reported in the literature. In one such cell, a three-dimensional STC structure above the substrate is extended downward by trenching into the substrate. Both the stack as well the trench extension are filled with polysilicon. In another approach, the wing-like storage electrode of one memory cell laterally overlaps a similar storage electrode of the neighboring cell with insulating material therebetween. Both of these structures are reported to be possible candidates for making 64 M-bit DRAMs possible, according to S. Wolf cited above. It will be seen in the present invention that still another post structure readily lends itself to the manufacture of very high-density DRAMs. Furthermore, it will be disclosed later that the forming of such a capacitor node in the form of a post eliminates the need for a mask for opening contact holes over the active regions on the substrate.

The said posts of this invention can also be utilized very effectively in the planarization process that is required subsequent to the forming of features on a substrate.

Planarization of integrated circuit devices is necessary and desirable to facilitate masking and etching operations. A planarized surface provides a constant depth of focus across the surface of the substrate for exposing patterns in a photolithography emulsion. Planarization becomes more difficult when the pattern of the features vary from location to location on the substrate, and especially when the aspect ratio (defined as the height of a feature divided by the distance to the closest feature) is greater than about 1.6 (U.S. Pat. No. 5,312,512). Known methods for planarizing sub-micron device geometries include multiple silicon oxide depositions with insitu etches to fill the spaces in between the features and then performing chemical mechanical polishing (CMP) which is well known in the art. However, as described in U.S. Pat. No. 5,312,512, this method suffers from the disadvantages of high expense, low throughput, process complexity and high defect density. In the present invention, by a judicious use of stand-alone pillars of the same shape and form as the posts used as capacitor nodes, the underlying pattern is made more uniform, and hence more amenable to CMP.

Post-like structures are also used in U.S. Pat. No. 5,094,972, however, by first forming a stop layer upon the surface of the substrate. Said stop layer is used to signal the end of polishing at a particular level in the multilevel structure. This step is avoided in the present invention. Since the various levels are interconnected through via holes therebetween, U.S. Pat. No. 4,582,563 proposes improving the reliability of such connections by forming via holes in two steps instead of forming the whole length of deep via holes through relatively thick insulating layers. The problem of forming interconnections through thick insulating layers is also addressed by U.S. Pat. No. 4,592,802. In order to prevent the rupture at the level of the contact opening win the insulating layer between the interconnection layer and the substrate, the contact openings are first filled with polycrystalline silicon and deposited by chemical decomposition in gas phase, whereupon aluminum is deposited by vacuum evaporation.

While the techniques described above may be employed in prior art, the novel post structures of the present invention provide additional structural integrity in general, and improved functionality, in particular, through increased capacitive characteristics.

SUMMARY OF THE INVENTION

It is therefore an object of this invention to provide a method for fabricating very high density DRAMs such as 64 Mega-bit, 256 M-bit or 1 Giga-bit.

It is a further object of this invention to provide a simplified high density memory cell with a post structure.

These objects are achieved by a cell structure in which the capacitor nodes are formed in the shape of posts that fit in an area no larger than that which is over the active regions of the semiconductor substrate. Hence, the posts are suitable to accommodate the area that is appropriate for any one of the very high density DRAMs up to and including 1 G-bit. The interior of said post structure is filled preferably with polysilicon II (meaning, second layer) while the exterior wall is comprised of another layer of polysilicon III separated from the inner polysilicon II by a dielectric composite consisting of silicon dioxide ($SiO_2$), silicon-nitride ($Si_3N_4$) and $SiO_2$, or ONO, as is known in the art. It will also be known to those skilled in the art that the first polysilicon I is formed over the gate-oxide and is connected to aluminum word-lines of the memory cell. The bit-lines are connected to n- regions of the substrate.

In an alternate structure, but in the same spirit of said posts of the present invention, optional pillars are formed at judiciously chosen locations in the cell to provide additional storage nodes and/or more uniform support structures to more readily facilitate chemical-mechanical polishing (CMP) of the substrate surface.

In still another alternate structure, but in the same spirit of said posts of the present invention, a multiplicity of said pillars are formed over contact areas to form interconnects between said contact areas.

These objects are further achieved by a method of manufacturing in which a layer of silicon-nitride is deposited over a substrate provided with active regions and first polysilicon I gate connected to word-line. PECVD oxide is next deposited and etched back using reactive ion etch. In a preferred embodiment, planarization layers of borophosphosilicate glass (BPSG) or tetraethyl orthosilicate (TEOS) films are deposited followed by chemical-mechanical polishing (CMP). Using one mask, in contrast two masks used in prior art, contact holes are made and node openings formed through the oxide layer by etching means. Polysilicon II is next deposited and then etched back in combination with CMP; TEOS or BPSG is removed, followed by the removal of silicon-nitride. A thin layer of ONO composite is then deposited followed by the deposition of polysilicon III, which in turn is etched to form the post structures. The substrate with the formed post structures is next deposited with BPSG or TEOS and planarized after which second set of contact holes are opened. These holes are filled with polysilicon IV and etched back to form the connections to bit-lines. In the same step, and optionally, source/drain contacts of the active devices are opened in the peripheral circuits of the chip on the semiconductor substrate. Interconnections to the next level of metal are then made using conventional methods.

In an alternate approach, branched-post structures are formed comprising a multiplicity of vertical fin like structures which makes possible the manufacture of capacitors with high capacitance in a very small area. This structure is predicted to allow cells with four fins to be used in a 1 G-bit DRAM.

BRIEF DESCRIPTION OF THE DRAWINGS

FIG. 1 is a cross-section of a substrate showing conventional memory cell of a DRAM.

FIG. 2a is a cross-section of a substrate showing MOS devices covered with a first dielectric layer.

FIG. 2b is a cross-section of a substrate showing etched holes for post structures.

DESCRIPTION OF THE PREFERRED EMBODIMENTS

Figure 2C:
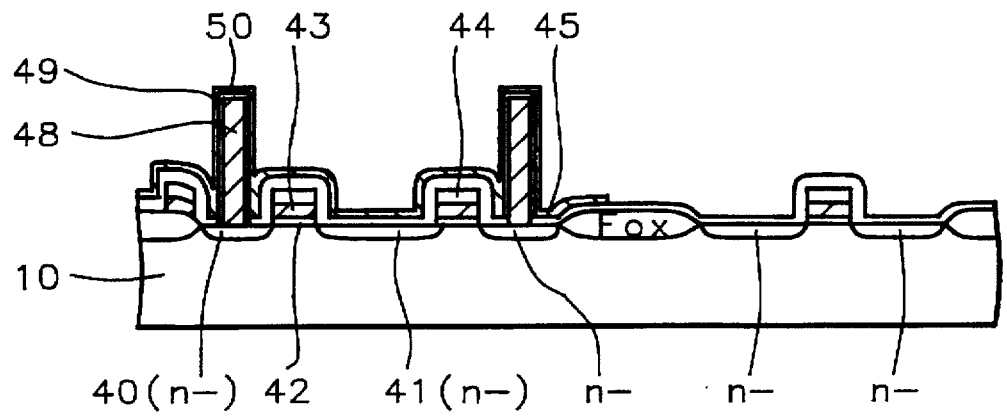
FIG. 2c is a cross-section of a substrate showing the formed post structures.
Figure 2D:
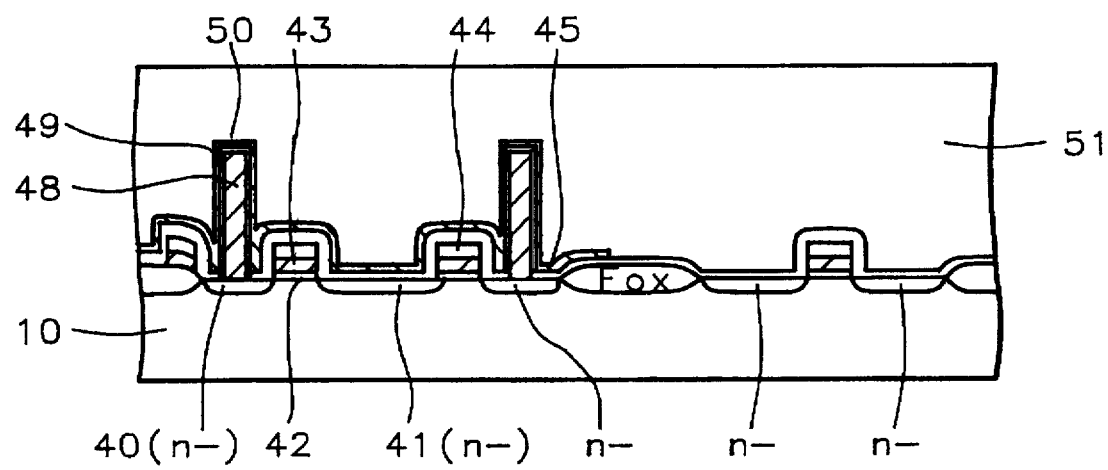
FIG. 2d is a cross-section of a substrate showing said post structures covered by a second dielectric layer.

Referring now to the drawings, more particularly to FIGS. 2c through 2g, and 3a through 3c, there are illustrated methods and resulting structures of the novel process for producing a memory cell with high storage capacity and small foot-print for very high density dynamic random access memory or DRAM.

In order to appreciate more the methods and structures of the present invention, a conventional DRAM structure is shown in FIG. 1 for comparison. There, a semiconductor substrate (10) is shown on which a first polysilicon I gate (21) is formed on gate oxide (11) to serve as access transistor. (So as to not obscure the objectives of the present invention, it will not be necessary to describe in detail the function of the access transistor except to mention that contact is made between the gate of this transistor and the word-line of DRAM). An oxide (20) is grown on polysilicon I as a further protection of the active regions in the substrate. In the process sequence of forming the storage electrode in FIG. 1, first a mask (not shown) is used to open the contact area (22). Then a layer of conformal polysilicon is deposited as a node electrode. A second mask is used to open a larger hole (23) to form the storage electrode, or node (24). The node is formed by depositing second polysilicon II which is shown as (24) in FIG. 1. A thin layer of capacitor dielectric (25) separates the inner node (24) from the outer electrode (26) which is also formed of polysilicon, and referred to as polysilicon III to differentiate it from the polysilicon used previously. Bit lines (30 and 29) are usually connected to aluminum lines while the word lines consist of polysilicon, in general.

FIG. 1, which is not to scale, is meant to depict relatively low profile storage capacitor regions (28) in comparison with the post structures of FIG. 2 of the present invention. This has implications in terms of the area available for charge storage. It will also become evident later that because of the nature of these structures, the respective topography of the layers can be very different. Thus, it is seen in FIG. 1 that the layers 31 and 32 undulate considerably thereby making planarization difficult. These problems are addressed in the present invention.

Referring now more particularly to FIG. 2a of the present invention, a substrate 10 is shown along with source and drain regions 40 and 41, respectively, and gate oxide 42 under polysilicon gate 43 for metal-oxide-semiconductor (MOS) dynamic random access memory (DRAM) cell devices. These are formed by methods well known in the art and as they are not significant to the invention, will not be described in detail here. It is sufficient to note that the substrate, preferably silicon, in FIG. 2a has been subjected to many different process steps including field isolation, gate definition and ion implants. The devices in the active regions are further protected in this invention by growing oxide layer 44 which in turn is covered by a layer of $Si_3N_4$ (45), that is, silicon-nitride (SIN). In one embodiment of the present invention, the nitride is deposited to a thickness of between about 100 nanometers (nm) to 200 nm in a fluorinated gas environment. Region 46 in FIG. 2a is an interlevel dielectric; usually a silicon dioxide ($SiO_2$) glass doped with boron and/or phosphorous and referred to as borophosphosilicate glass (BPSG). The oxide is deposited by means of chemical vapor deposition (CVD, and then planarized by reactive ion etch (RIE). The preferred dielectric in this invention is a low-temperature film deposited by decomposing tetraethyl orthosilicate (TEOS) for its easier handling during chemical mechanical polishing (CMP). However, to be able to remove the residual oxides after polishing, a combination of CMP and etchback is used in this invention. The actual steps used are not critical to the spirit of this invention.

In a critical step of the invention, with reference to FIG. 2b, openings (47) are next made by a lithography-and-etch step. A mask is used to define opening patterns in a photoresist film (not shown), and a dry-etch process is then used to open holes through the dielectric layer (46) to the underlying n- regions in the silicon. The dry etch is performed at a pressure in between about 200 to 500 millitorr, a power in between about 50 to 200 watts, using a fluorocarbon gas such as $CF_4$ or $CHF_3$ at a volume rate of between about 5 to 50 sccm (standard cubic centimeters per minute). Unlike in prior art, a single mask is used to make openings 47, which are then used to form the post structures that are key to this invention. The post structures will serve as the capacitor polysilicon electrodes of the memory cel The holes thus etched are fully open, without a constriction as in the conventional cell of FIG. 1, to accept the second polysilicon of this invention. The holes are filled up with polysilicon II (48) so as to connect this electrode to the drain of the access transistor. This step, therefore, does not reduce the effective area of the capacitor, as in prior art, especially for holes with small dimensions. Since the polysilicon fill will serve as one plate of the capacitor, it must be highly doped. Doping is accomplished in situ during deposition and by ion implanting with arsenic or phosphorus, at a concentration of between about $5 \times 10^4$ atoms/$cm^2$ to $5 \times 10^{15}$ and an energy of between about 30 KeV to 100 KeV. After filling of the holes, a combination of etchback and/or CMP is performed so that the tops of the electrode/posts (48) so formed are planarized. It will be appreciated by those skilled in the art that said post structures perform the multi-function of providing a good support during the planarization process. In fact, it will be seen in more detail later on that these posts may be formed at various other places to aid in making the underlying patterns more uniform, and hence the layers more amenable to planarization.

After planarization, all of the first dielectric layer is removed by means of wet or dry etching with high selectivity to polysilicon and nitride, and the now exposed nitride layer is also removed. Next, a composite oxide layer, ONO, is deposited. To form the ONO structure (49) as shown in FIG. 2b, layers of silicon dioxide ($SiO_2$), silicon-nitride ($Si_3N_4$) and silicon dioxide are formed in said sequence. The first $SiO_2$ layer is formed as a native oxide during the previous process steps. The $Si_3N_4$ layer is deposited by LPCVD to a thickness of between about 40 and 60 Angstroms. The final $SiO_2$ layer is formed by thermal oxidation to a thickness of between about 10 and 15 Angstroms. A third polysilicon layer (50) is now deposited, by LPCVD, to form a layer with a thickness of between about 50 to 1500 Angstroms. Doping is accomplished by ion implantation with arsenic or phosphorus, at a concentration of between about $5 \times 10^{14}$ atoms/$cm^2$ to $5 \times 10^{15}$ and an energy of between about 30 KeV to 100 KeV. This layer of polysilicon III is etched to form the outer electrode (50). Hence, the post structure, comprised of electrodes (48) and (50), and separated from each other by a thin dielectric layer of ONO (49) form the capacitor of the memory cell.

Figure 2E:
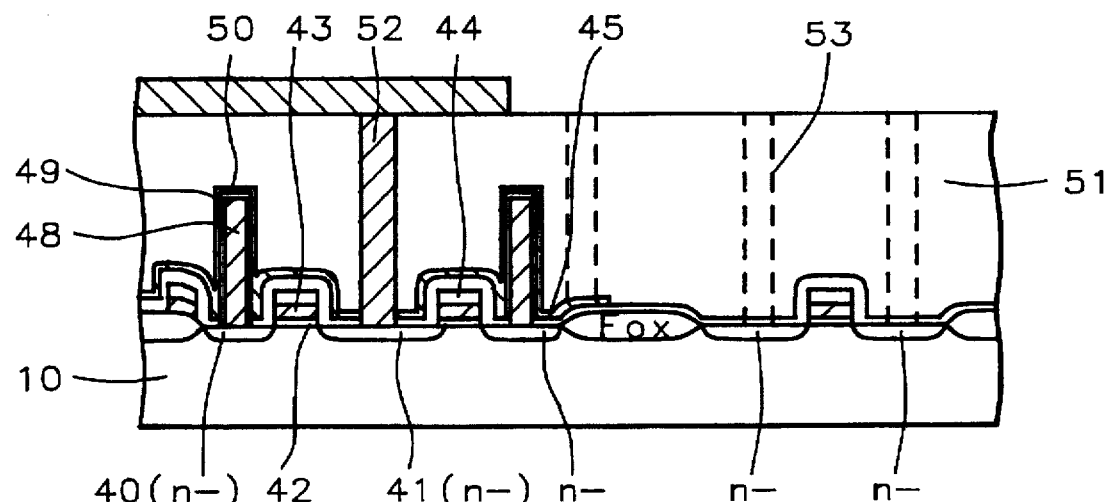
FIG. 2e is a cross-section of a substrate showing a formed bit-line.

In the next step of FIG. 2e, a second dielectric layer (51) is deposited with the same materials and in the same manner as described earlier for the first dielectric (46) of FIG. 2a. Planarization is likewise the same as described earlier. Holes are etched all the way through in this layer (51) to reach the source regions (41) in the silicon. A fourth polysilicon IV layer is deposited and dry etched to form bit-lines (52) as shown in FIG. 2e. Word-lines (not shown) are implemented with aluminum and are connected to first polysilicon I gates (43) shown in FIG. 2a.

Region (53) in FIG. 2e represents areas of peripheral circuits such as for redundancy or error-detection and correction. The contact openings in these regions can also be opened with the same mask and at the same time the openings for said post structures are formed. That is, region (53) and (52) are formed simultaneously, as an option.

Figure 2F:
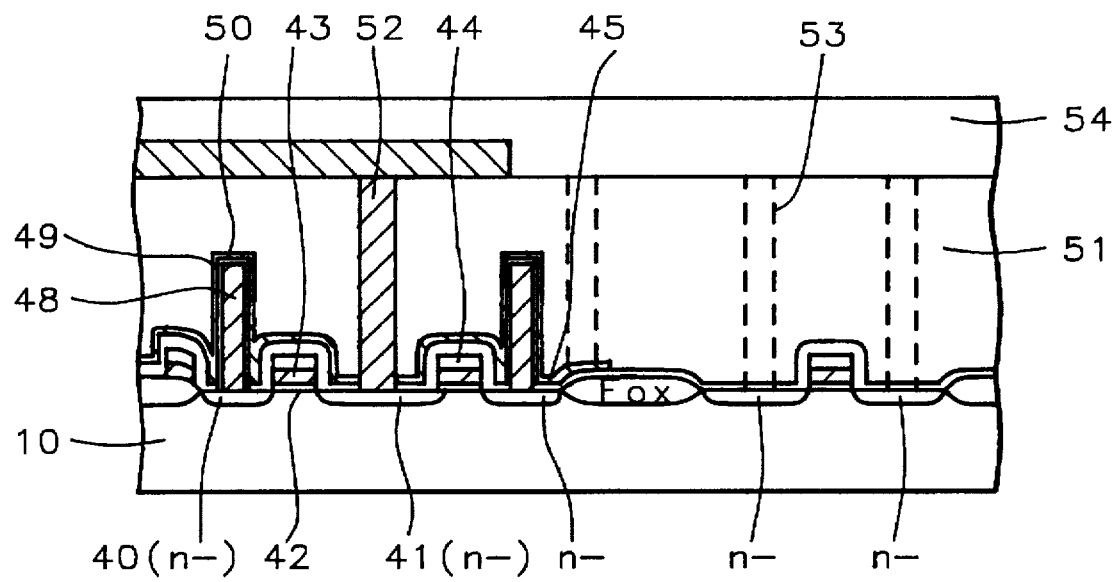
FIG. 2f is a cross-section of a substrate showing said lines being covered with a third dielectric layer.
Figure 2G:
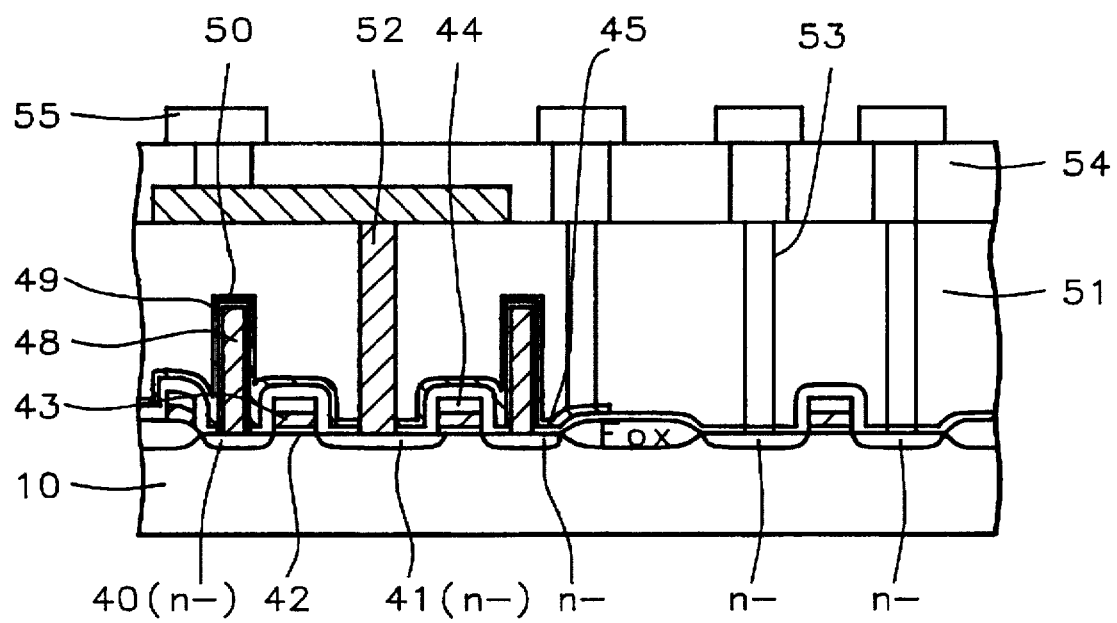
FIG. 2g is a cross-section of a substrate showing interconnections between layers.

A third dielectric layer (54) is deposited as shown in FIG. 2f and planarized similar to second and first dielectric layers 51 and 52, respectively, and appropriate intermetal connections (55) of FIG. 2g are made using prior methods. In the embodiment of the present invention, the preferred metal is aluminum.

Figure 3A:
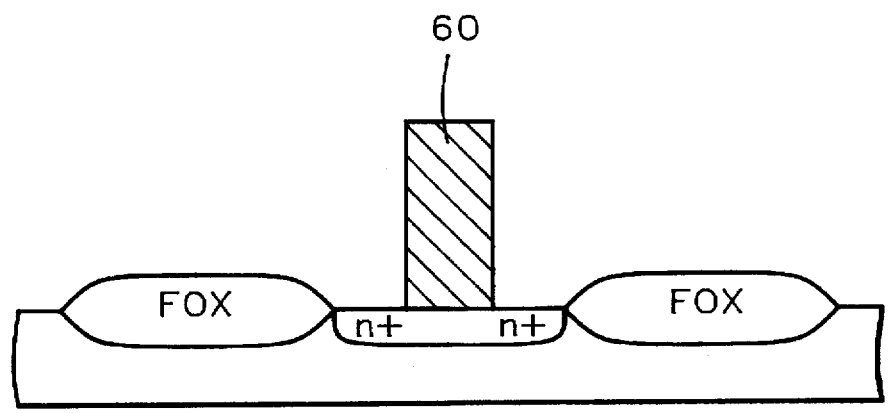
FIG. 3a is a schematic drawing of a post structure.
Figure 3B:
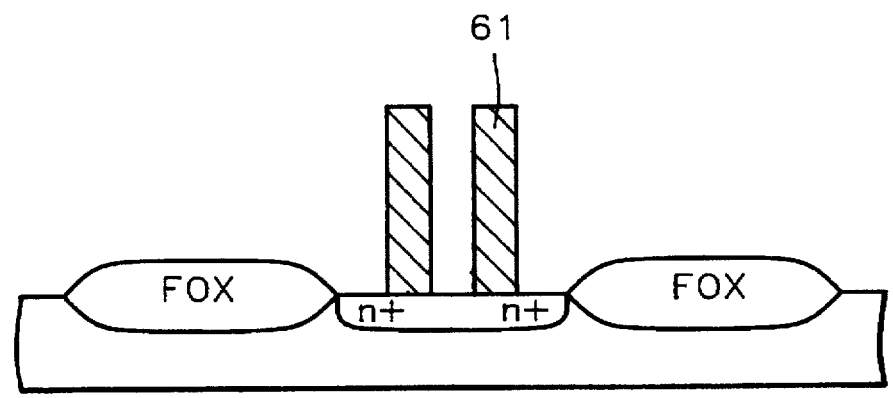
FIG. 3b is a schematic drawing of a multiplicity of post structures, or pillars.

In an alternate approach to increasing the storage capacity of capacitors in DRAMs, the unitary post structure of this invention as shown in FIG. 3a can be enhanced further. This is accomplished by replacing the one unitary structure (60) with a multiplicity of such structures, or pillars (61), as shown in FIG. 3b. It can be shown that for a given foot-print area, and height available within that area, there is an optimum number of such structures that can be formed for a given set of design and cost constraints. In the embodiment of this invention, therefore, a plurality of such posts are preferred as shown in FIG. 3b and FIG. 3c.

Figure 3C:
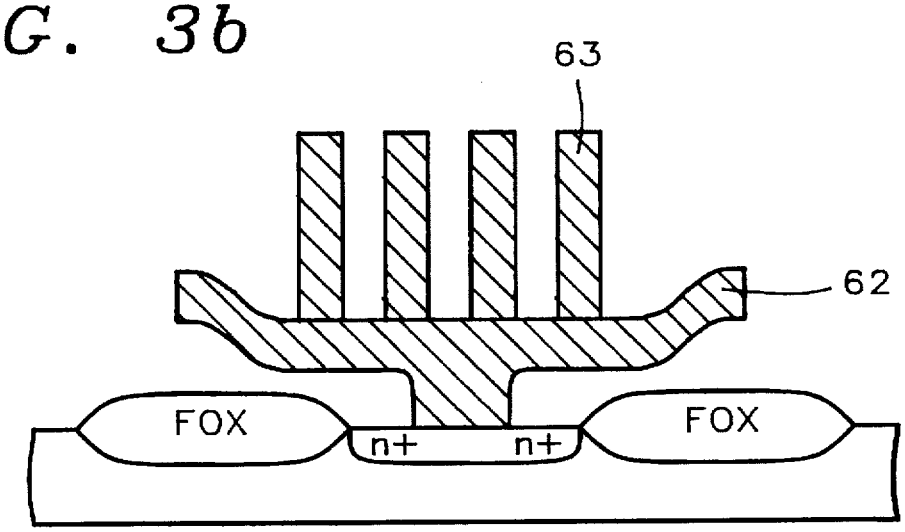
FIG. 3c is a schematic drawing of a branched-post structure.

The branched-post structure 62 shown in FIG. 3c is comprised of fin like structures (63) which makes possible the manufacture of capacitors with high capacitance in a very small area. This structure is predicted to allow cells with four fins as shown to be used in a 1 G-bit DRAM.

While the invention has been particularly shown and described with reference to the preferred embodiments thereof, it will be understood by those skilled in the art that various changes in form and details may be made without departing from the spirit and scope of the invention.

What is claimed is:

1. A method of forming multipurpose unitary post structures as storage nodes in dynamic random access memory (DRAM) cells comprising the steps of:

providing a semiconductor substrate over which are formed first polysilicon I gates on gate oxide;

depositing over said substrate a layer of silicon nitride (SIN);

depositing over said SiN a first layer of dielectric;

planarizing said first dielectric layer;

forming a mask over said first dielectric layer;

opening first set of contact holes through said first dielectric layer;

forming said storage node openings in said first dielectric layer for said unitary post structures;

etching native oxide formed in said contact holes;

depositing second polysilicon II over said substrate;

etching back said polysilicon II layer;

removing said first dielectric layer to form said unitary post structures;

removing said silicon nitride layer;

depositing dielectric film over said substrate;

depositing third polysilicon III layer over said dielectric film;

etching said polysilicon III layer to form outer node electrode;

depositing second dielectric layer over said substrate;

planarizing said second dielectric layer;

opening second set of contact holes through said second dielectric layer;

opening contact holes on the periphery of chip sites;

depositing fourth polysilicon IV over said substrate;

etching back said polysilicon IV layer;

depositing third dielectric layer over said substrate;

planarizing said third dielectric layer;

opening third set of contact holes through said third dielectric layer;

depositing metal layer over said substrate;

etching said metal layer to form patterns; and depositing a passivation layer over said substrate.

2. The method of claim 1, wherein said silicon nitride is fluorinated.

3. The method of claim 1, wherein said first dielectric layer is chemical vapor deposited (CVD) oxide.

4. The method of claim 1, wherein said first dielectric layer consists of a material with high selectivity for polysilicon and nitride.

5. The method of claim 4, wherein said first dielectric layer is Borophosphosilicate Glass (BPSG).

6. The method of claim 4, wherein said first dielectric layer is TEOS film deposited by decomposition of tetraethyl orthosilicate.

7. The method of claim 1, wherein said planarization is performed by reactive ion etch (RIE).

8. The method of claim 1, wherein said planarization is performed by chemical mechanical polishing (CMP).

9. The method of claim 1, wherein said mask is formed with photolithography emulsion.

10. The method of claim 9, wherein said mask is patterned over contact regions on said substrate.

11. The method of claim 9, wherein said mask is positioned over said unitary post regions on said substrate.

12. The method of claim 1, wherein said contact holes are dry etched.

13. The method of claim 1, wherein said node openings are dry etched over unitary post regions.

14. The method of claim 1, wherein said oxide etching in contact holes is accomplished by means of wet etch.

15. The method of claim 1, wherein said polysilicon II is blanket deposited by means of CVD.

16. The method of claim 1, wherein said polysilicon II is etched back by means of RIE.

17. The method of claim 1, wherein said first dielectric layer is removed by means of dry etch.

18. The method of claim 1, wherein said silicon nitride is removed by means of dry etch.

19. The method of claim 1, wherein said dielectric film is a composite consisting of $SiO_2/SiN/SiO_2$ layers (ONO).

20. The method of claim 1, wherein said polysilicon III is blanket deposited by means of CVD.

21. The method of claim 1, wherein said polysilicon III is etched by means RIE.

22. The method of claim 1, wherein said second dielectric layer consists of a material with high selectivity for polysilicon and nitride.

23. The method of claim 1, wherein said second dielectric layer is chemical vapor deposited (CVD) oxide.

24. The method of claim 1, wherein said second dielectric layer is Borophosphosilicate Glass (BPSG).

25. The method of claim 1, wherein said second dielectric layer is TEOS film deposited by decomposition of tetraethyl orthosilicate.

26. The method of claim 1, wherein said planarization of said second dielectric layer is performed by reactive ion etch (RIE).

27. The method of claim 1, wherein said planarization of said second dielectric layer is performed by chemical mechanical polishing (CMP).

28. The method of claims 1, wherein said second set of contact holes are dry etched.

29. The method of claim 1, wherein said holes in the peripheral area are dry etched.

30. The method of claim 1, wherein said polysilicon IV is blanket deposited by means of CVD.

31. The method of claim 1, wherein said polysilicon IV is etched by means RIE.

32. The method of claim 1, wherein said third dielectric layer consists of a material with high selectivity for polysilicon and nitride.

33. The method of claim 1, wherein said third dielectric layer is chemical vapor deposited (CVD) oxide.

34. The method of claim 1, wherein said third dielectric layer is Borophosphosilicate Glass (BPSG).

35. The method of claim 1, wherein said third dielectric layer is TEOS film deposited by decomposition of tetraethyl orthosilicate.

36. The method of claim 1, wherein said planarization of said third dielectric layer is performed by reactive ion etch (RIE).

37. The method of claim 1, wherein said planarization of said third dielectric layer is performed by chemical mechanical polishing (CMP).

38. The method of claims 1, wherein said third set of contact holes are dry etched.

39. The method of claim 1, wherein said metal is aluminum.

40. The method of claim 1, wherein the said passivation layer is BPSG.

41. A method of forming multipurpose branched-post structures as storage nodes in dynamic random access memory (DRAM) cells comprising the steps of:

providing a semiconductor substrate over which are formed first polysilicon I gates on gate oxide;

depositing over said substrate a layer of silicon nitride (SIN);

depositing over said SiN a first layer of dielectric;

planarizing said first dielectric layer;

forming a mask over said first dielectric layer;

opening contact holes through said first dielectric layer;

forming node openings in said first dielectric layer for said branched-post structures;

etching native oxide in said contact holes;

depositing second polysilicon II over said substrate;

etching back said polysilicon II layer;

removing said first dielectric layer to form said branched-post structures;

removing said silicon nitride layer;

depositing dielectric film over said substrate;

depositing third polysilicon III layer over said dielectric film;

etching said polysilicon III layer to form outer node electrode;

depositing second dielectric layer over said substrate; and planarizing said second dielectric layer.

42. The method of claim 41, wherein said mask has patterns for branched-post structures.

43. A method of forming multipurpose unitary and branched post structures as storage nodes in dynamic random access memory (DRAM) cells comprising the steps of:

providing a semiconductor substrate over which are formed first polysilicon I gates on gate oxide;

depositing over said substrate a layer of silicon nitride (SIN);

depositing over said SiN first layer of dielectric;

planarizing said first dielectric layer;

forming a mask over said first dielectric layer;

opening contact holes through said dielectric layer;

forming node openings in said dielectric layer for said unitary and branched post structures;

etching native oxide in said contact holes;

depositing second polysilicon II over said substrate;

etching back said polysilicon II layer;

removing said first dielectric layer to form said unitary and branched post structures;

removing said silicon nitride layer;

depositing dielectric film over said substrate;

depositing third polysilicon III layer over said dielectric film;

etching said polysilicon III layer to form outer node electrode;

depositing second dielectric layer; and planarizing said second dielectric layer.

* * * * *